United States Patent
Matsuo et al.

(10) Patent No.: US 7,859,073 B2
(45) Date of Patent: Dec. 28, 2010

(54) BACK-ILLUMINATED TYPE SOLID-STATE IMAGE PICKUP DEVICE AND CAMERA MODULE USING THE SAME

(75) Inventors: Mie Matsuo, Kamakura (JP); Yusuke Kohyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/166,810

(22) Filed: Jul. 2, 2008

(65) Prior Publication Data

US 2009/0014762 A1 Jan. 15, 2009

(30) Foreign Application Priority Data

Jul. 6, 2007 (JP) .............................. 2007-178987

(51) Int. Cl.
*H01L 31/0203* (2006.01)
(52) U.S. Cl. ................ 257/434; 257/447; 257/E27.133
(58) Field of Classification Search ................ 257/431, 257/434, E27.133, 447
See application file for complete search history.

(56) References Cited

U.S. PATENT DOCUMENTS

| | | | | |
|---|---|---|---|---|
| 6,703,689 | B2 * | 3/2004 | Wada | 257/621 |
| 7,279,712 | B2 | 10/2007 | Abe et al. | |
| 2005/0029643 | A1 * | 2/2005 | Koyanagi | 257/680 |
| 2005/0275048 | A1 * | 12/2005 | Farnworth et al. | 257/431 |
| 2006/0076590 | A1 | 4/2006 | Pain et al. | |
| 2006/0197007 | A1 * | 9/2006 | Iwabuchi et al. | 250/208.1 |
| 2007/0117253 | A1 | 5/2007 | Hsu et al. | |
| 2008/0116537 | A1 * | 5/2008 | Adkisson et al. | 257/448 |

FOREIGN PATENT DOCUMENTS

| | | |
|---|---|---|
| CN | 1871708 A | 11/2006 |
| JP | 3722367 | 9/2005 |
| JP | 2006-19653 | 1/2006 |
| KR | 10-2006-0096924 | 9/2006 |
| WO | WO 2005/093857 A1 | 10/2005 |

\* cited by examiner

*Primary Examiner*—Wael M Fahmy
*Assistant Examiner*—John C Ingham
(74) *Attorney, Agent, or Firm*—Oblon, Spivak, McClelland, Maier & Neustadt, L.L.P.

(57) ABSTRACT

The present invention provides a solid-state image pickup device including an image pickup pixel section which is provided on a semiconductor substrate and in which a plurality of pixels each having a photoelectric conversion element and a field-effect transistor are arranged, and a peripheral circuit section for the image pickup pixel section. An interconnect layer driving the field-effect transistor in the image pickup pixel section is formed on a first surface side of the semiconductor substrate. A light receiving surface of the photoelectric conversion element is located on a second surface side of the semiconductor substrate. The solid-state image pickup device includes a first terminal exposed from the second surface side of the semiconductor substrate, and a second terminal electrically connected to the first terminal and connectable to an external device on the first surface side of the semiconductor substrate.

8 Claims, 7 Drawing Sheets

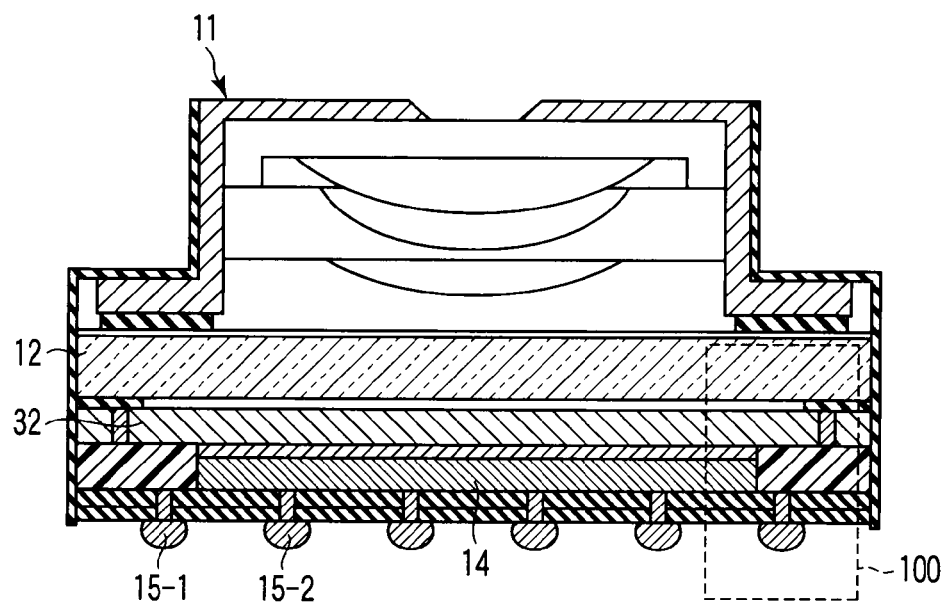
F I G. 1
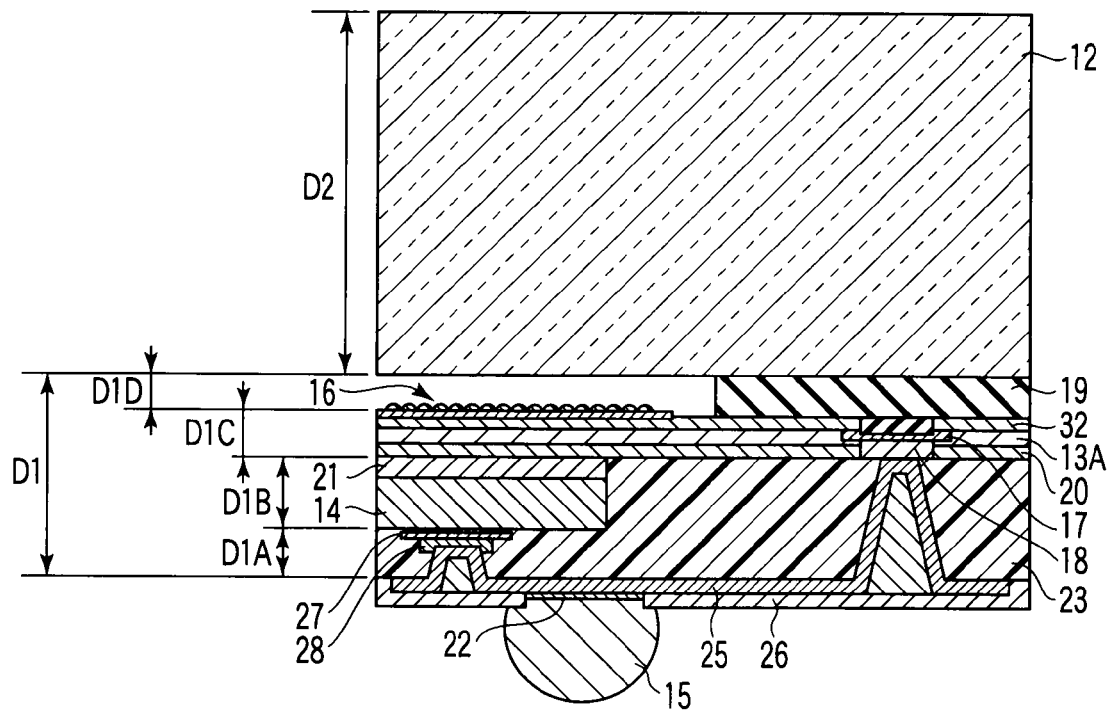
F I G. 3

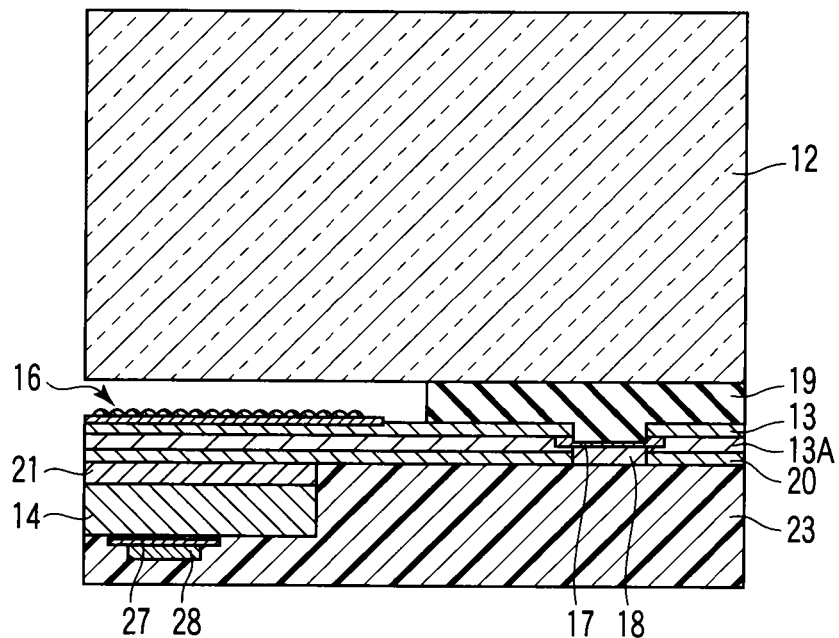
F I G. 7
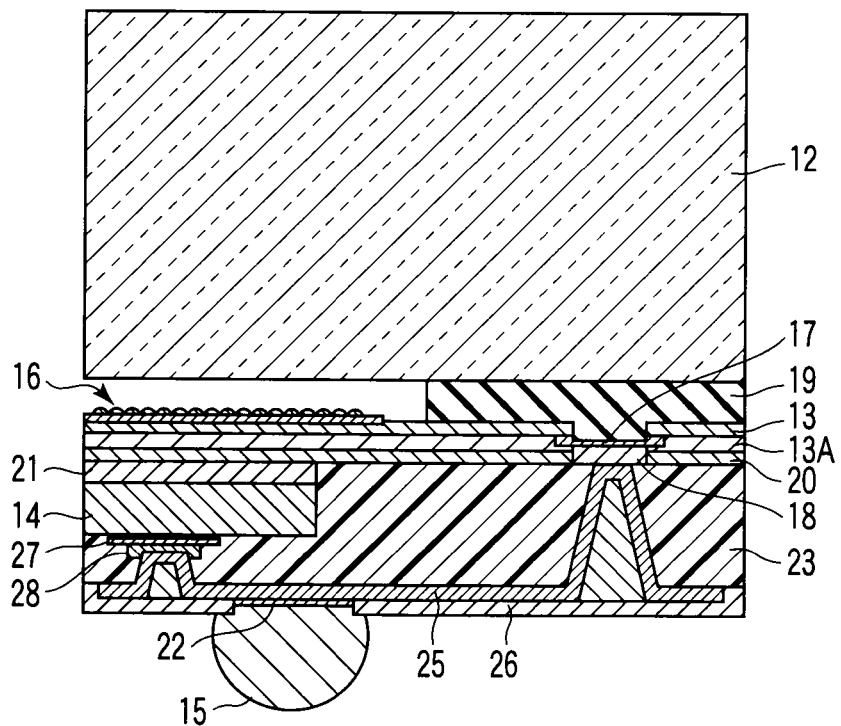
F I G. 8

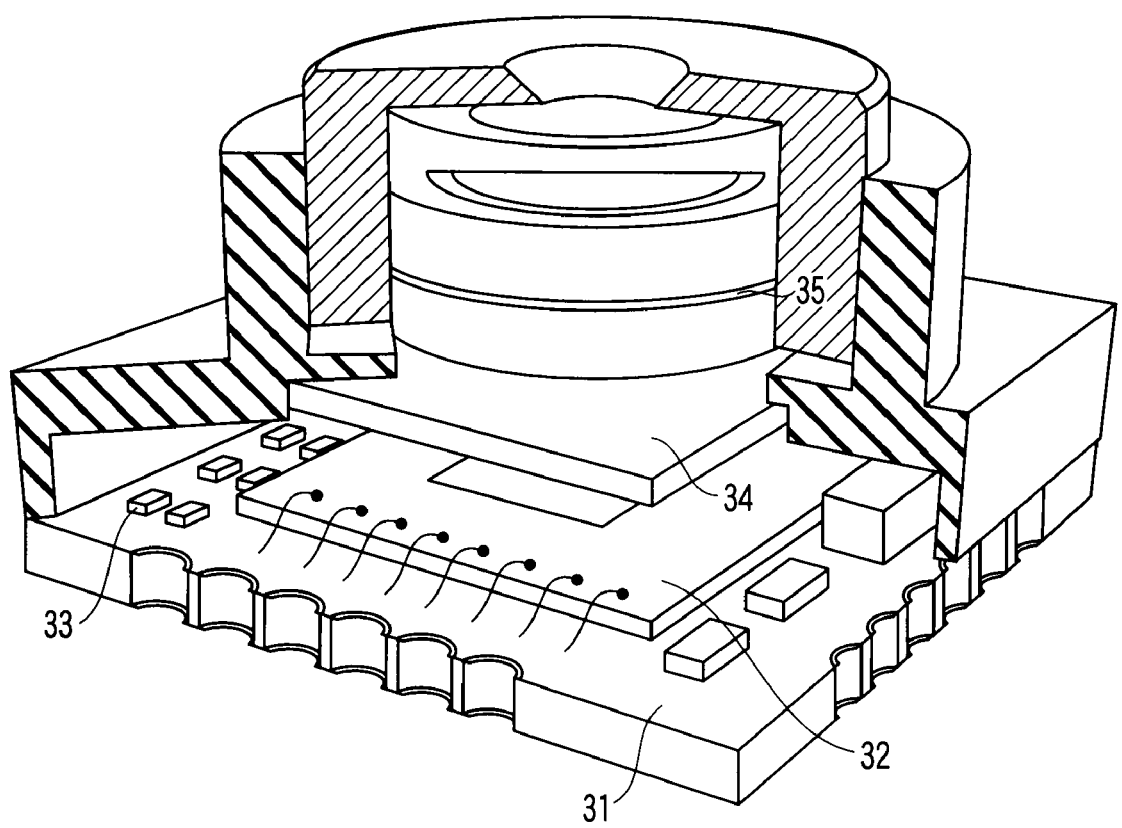
F I G. 11

BACK-ILLUMINATED TYPE SOLID-STATE IMAGE PICKUP DEVICE AND CAMERA MODULE USING THE SAME

CROSS-REFERENCE TO RELATED APPLICATIONS

This application is based upon and claims the benefit of priority from prior Japanese Patent Application No. 2007-178987, filed Jul. 6, 2007, the entire contents of which are incorporated herein by reference.

BACKGROUND OF THE INVENTION

1. Field of the Invention

The present invention relates to a back-illuminated type solid-state image pickup device including a light receiving surface of a photoelectric conversion element provided on a back surface side of a semiconductor chip, and a camera module using the solid-state image pickup device.

2. Description of the Related Art

In recent years, video cameras and electronic cameras have prevailed. CCD or amplifying solid-state image pickup devices are used in these cameras. The amplifying solid-state image pickup device (CMOS image sensor) has an image pickup pixel section composed of a plurality of pixels two-dimensionally arranged on one semiconductor chip, and a peripheral circuit section located outside the image pickup pixel section. Various MOS transistors for transfer, amplification, or the like are provided in the pixels of the image pickup pixel section. Light entering each of the pixels is photoelectrically converted by a photodiode to generate a signal charge. The transfer transistor and the amplifying transistor convert the signal charge into an electrical signal and amplifies the electrical signal to output the signal from the pixel to the peripheral circuit section through a signal line.

In the solid-state image pickup device configured as described above, in order to increase the numerical aperture of the photodiode (the ratio of light incident on the photodiode to light incident on the pixel), each pixel uses a microlens to condense the incident light on the photodiode through between interconnects. However, in this case, the light condensed by the microlens is partly shielded by a signal interconnect from the photodiode. This may pose the following problems.

(1) Since the light is partly shielded by the interconnects, sensitivity decreases.

(2) The light shielded by the interconnects is partly reflected and enters the photodiode of the adjacent pixel, resulting in color mixture.

(3) The layout of the interconnects is limited, and the characteristics of FET are degraded by restrictions such as the hindrance of the placement of the interconnects over the photodiode and the prevention of passage of thick interconnects.

(4) Miniaturization is difficult for a reason similar to that in (3).

(5) Light is likely to obliquely enter pixels in a peripheral area and to increase reflect, and darker shading occurs in areas closer to the periphery.

(6) When an attempt is made to produce a CMOS image sensor using an advanced process with a further increased number of interconnect layers, the distance from the microlens to the photodiode increases, and such difficulties as described above become more serious.

(7) (6) inhibits the use of a library for the advanced CMOS process, and the layout of circuits registered in the library needs to be changed or the interconnect layers are limited, thus increasing the required area. This increases costs and the area of each pixel.

To solve these problems, what is called a back-illuminated type solid-state image pickup device has recently been proposed which includes a light receiving surface of the photodiode provided on a back surface side of the semiconductor chip (see, for example, Jpn. Pat. No. 3722367).

However, with the back-illuminated type solid-state image pickup device, when a tester is used to test how well a wafer has been produced, images cannot be tested at a wafer level. That is, with the normal CMOS image sensor, a color filter and an on-chip microlens are formed on the wafer, and the light receiving surface is irradiated with light. Signals are obtained via a pad formed in the peripheral circuit section to check images. However, with the back-illuminated type, the wafer has no test pad on the back surface side (light receiving surface). Thus, an electrode needs to be provided on a front surface side of the wafer where interconnects are formed. Thus, it is difficult to irradiate the CMOS image sensor with light for image testing at the wafer level. Consequently, the wafer is diced into individual pieces, and a mounting step is then carried out to form camera modules for testing. Thus, manufacturing efficiency decreases.

BRIEF SUMMARY OF THE INVENTION

An aspect of the present invention provides a solid-state image pickup device comprising an image pickup pixel section which is provided on a semiconductor substrate and in which a plurality of pixels each having a photoelectric conversion element and a field-effect transistor are arranged, and a peripheral circuit section for the image pickup pixel section, an interconnect layer driving the field-effect transistor in the image pickup pixel section being formed on a first surface side of the semiconductor substrate, a light receiving surface of the photoelectric conversion element being located on a second surface side of the semiconductor substrate, the solid-state image pickup device further comprising a first terminal exposed from the second surface side of the semiconductor substrate, and a second terminal electrically connected to the first terminal and connectable to an external device on the first surface side of the semiconductor substrate.

An aspect of the present invention provides a solid-state image pickup device comprising an image pickup pixel section which is provided on a semiconductor substrate and in which a plurality of pixels each having a photoelectric conversion element and a field-effect transistor are arranged, and a peripheral circuit section for the image pickup pixel section, an interconnect layer driving the field-effect transistor in the image pickup pixel section being formed on a first surface side of the semiconductor substrate, a light receiving surface of the photoelectric conversion element being located on a second surface side of the semiconductor substrate, the solid-state image pickup device further comprising a pad electrode located on the first surface side of the semiconductor substrate and exposed from the second surface side of the semiconductor substrate, wherein a pad opening is formed on the pad electrode on the first surface side of the semiconductor substrate.

An aspect of the present invention provides a camera module comprising a solid-state image pickup device comprising an image pickup pixel section in which a plurality of pixels each having a photoelectric conversion element and a field-effect transistor are arranged, and a peripheral circuit section for the image pickup pixel section, an interconnect layer driving the field-effect transistor in the image pickup pixel section being formed on a first surface side of a semiconductor substrate, a light receiving surface of the photoelectric conversion element being located on a second surface side of the semiconductor substrate, the solid-state image pickup device further comprising a first terminal exposed from the second surface side of the semiconductor substrate, and a second terminal formed on the first surface side of the semiconductor substrate and electrically connected to the first terminal and the interconnect layer, the camera module further comprising a lens which condenses incident light on the light receiving surface of the photoelectric conversion element, a member having the first surface side of the semiconductor substrate mounted on one surface of the member and an external connection terminal provided on the other surface of the member, and an interconnect formed on the member so as to extend from the one surface side on which the semiconductor substrate is mounted to the other surface side, the interconnect being electrically connected to the external connection terminals.

BRIEF DESCRIPTION OF THE SEVERAL VIEWS OF THE DRAWING

FIG. 1 is a sectional view of the configuration of a camera module, illustrating a first embodiment of the present invention;

FIG. 3 is an enlarged sectional view showing a part of the camera module shown in FIG. 1, in detail;

FIG. 7 is a sectional view of a fourth process of manufacturing a camera module;

FIG. 8 is a sectional view of a fifth process of manufacturing a camera module;

FIG. 11 is a partly cutaway perspective view of a camera module illustrating a second embodiment of the present invention.

DETAILED DESCRIPTION OF THE INVENTION

First Embodiment

FIG. 1 is a sectional view of the configuration of a camera module illustrating a first embodiment of the present invention. The module has a lens unit 11, and cover glass 12, a back-illuminated type CMOS sensor chip 32, and a passive element chip (resistor, capacitor, or the like) 14 provided below the lens unit 11. The module also has solder balls 15-1, 15-2, . . . formed on a bottom surface as external connection terminals.

Figure 2:
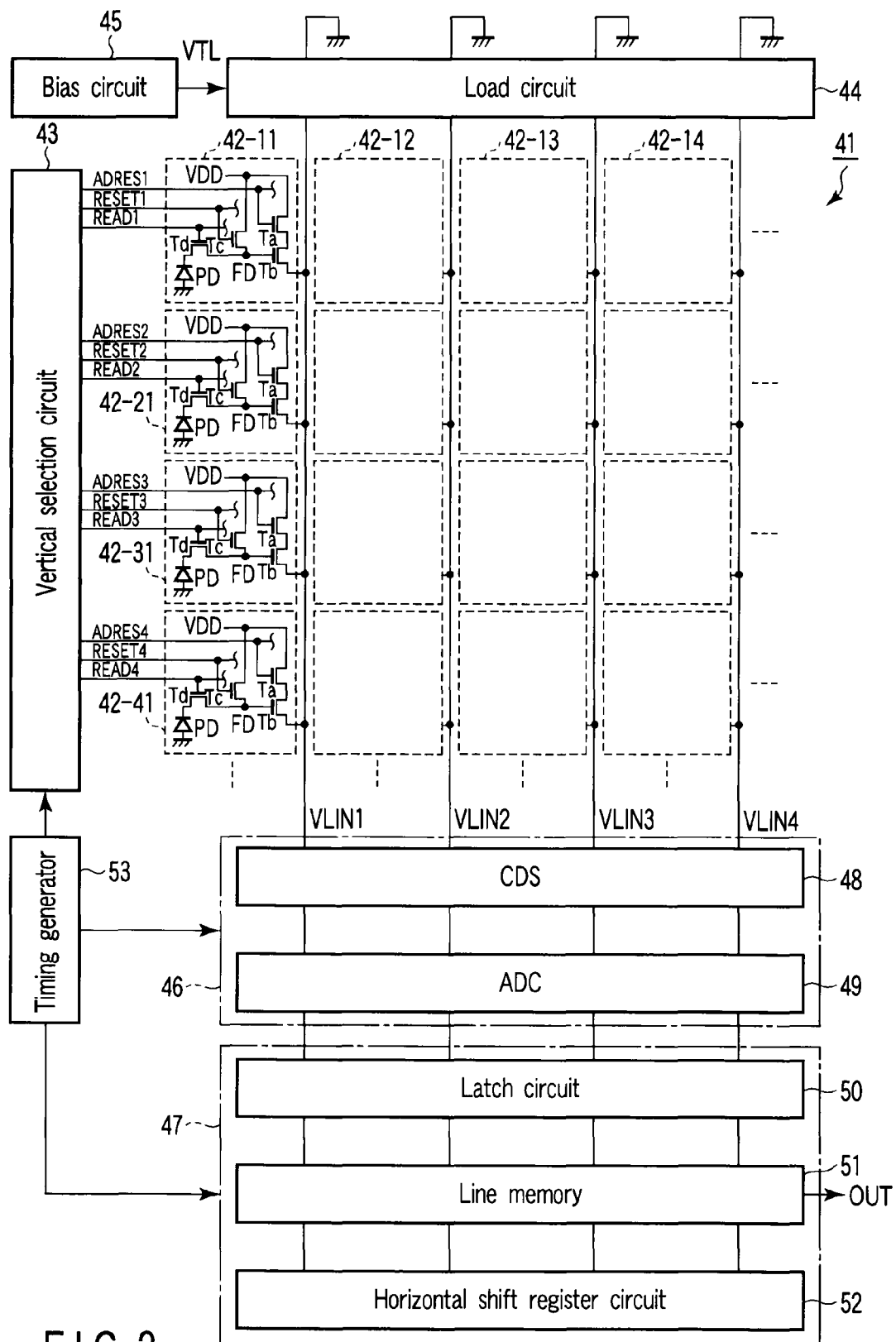
FIG. 2 is a circuit diagram showing an example of a general configuration of a sensor chip in the camera module shown in FIG. 1.

As shown in FIG. 2, an image pickup pixel section 41 and a peripheral circuit section for the image pickup pixel section 41 are provided in the sensor chip 32. Pixels 42-11, 42-12, . . . , 42-mn are arranged in the image pickup pixel section 41 in an m×n two-dimensional array. Here, four pixels from the image pickup pixel section 41 are shown in detail. Vertical signal lines VLIN1, VLIN2, VLIN3, . . . are connected to respective pixel columns in the image pickup pixel section 41.

Each of the pixels 42-11, 42-12, . . . , 42-mn includes four field-effect transistors (a row selection transistor Ta, an amplifying transistor Tb, a reset transistor Tc, and a read transistor Td) and a photodiode PD serving as a photoelectric conversion element. For example, in the pixel 42-11, a current paths of the transistors Ta and Tb is connected in series between a power supply VDD and the vertical signal line VLIN1. An address pulse ADRES1 is supplied to a gate of the transistor Ta. A current path of the transistor Tc is connected to between the power supply VDD and a gate (detecting section FD) of the transistor Tb. A reset pulse RESET1 is supplied to a gate of the transistor Tc. One end of a current path of the transistor Td is connected to the detecting section FD. A read pulse READ1 is supplied to a gate of the transistor Td. A cathode of the photodiode PD is connected to the other end of the current path of the transistor Td. An anode of the photodiode PD is grounded.

A signal charge generated by the photodiode PD is supplied to the detecting section FD via the current path of the read transistor Td, in response to the read pulse READ1. A signal charge from the detecting section FD is converted into an electrical signal by the amplifying transistor Tb, which then amplifies the electrical signal. When the address pulse ADRES1 selects the row selection transistor Ta, the power supply VDD supplies a current corresponding to the signal charge amount to the vertical signal line VLIN1. Once reading is completed, the signal charge from the detecting section FD is reset by the reset transistor Tc in response to the reset pulse RESET1.

The peripheral circuit section has a driving circuit that selects and drives the image pickup pixel section 41, a signal processing circuit that processes pixel signals output by the image pickup pixel section 41, and a data holding circuit that holds data from the signal processing circuit.

A vertical selection circuit 43 serves as a driving circuit that supplies the pixels in the image pickup pixel section 41 with pixel driving pulse signals such as the address pulses ADRES1, ADRES2, . . . , the reset pulses RESET1, RESET2, . . . , and the read pulses READ1, READ2, . . . to select and drive a pixel row.

In the image pickup pixel section 41, a load circuit 44 is provided between one end of each of the vertical signal lines VLIN1, VLIN2, VLIN3, . . . and the ground point. A bias circuit 45 applies a bias voltage VTL to the load circuit 44. The bias voltage VTL sets the amount of current flowing through the vertical signal lines VLIN1, VLIN2, VLIN3, . . . .

A signal processing circuit 46 and a data holding circuit 47 are provided at the other end of each of the vertical signal lines VLIN1, VLIN2, VLIN3, . . . . The signal processing circuit 46 is composed of a correlative double sampling (CDS) circuit 48 and an analog-to-digital converter (ADC) 49. The analog-to-digital converter 49 performs analog-to-digital conversion on data read from each of the pixels in the image pickup pixel section 41 onto a corresponding one of the vertical signal lines VLIN1, VLIN2, VLIN3, . . . . The correlative double sampling circuit 48 performs a noise reducing operation during the analog-to-digital conversion of the read data.

The data holding circuit 47 comprises a latch circuit 50, a line memory 51, and a horizontal shift register circuit 52. The data holding circuit 47 holds digital data resulting from signal processing by the signal processing circuit 46. The latch circuit 50 latches digital data resulting from the conversion by the analog-to-digital converter 49. The horizontal shift register circuit 52 sequentially transfers the digital data latched in the latch circuit 50. The line memory 51 stores the latched digital data and outputs the data to the exterior of the sensor chip 32 as an output signal OUT.

The following operations are controlled by timing signals output by a timing generator 53: the selecting and driving operation performed on the image pickup pixel section 41 by the vertical selection circuit 43, the operation of the signal processing circuit 46, the operation of the data holding circuit 47, and the like.

In the above-described configuration, an interconnect layer that drives the field-effect transistors Ta, Tb, Tc, and Td in each of the pixels in the image pickup pixel section 41 is formed on a front surface side (first surface side) of the sensor chip (semiconductor substrate) 32 in FIG. 1. A light receiving surface of the photodiode PD is located on a back surface side (second surface side) of the sensor chip 32. Light entering the lens unit 11 impinges on the light receiving surface of the photodiode PD, formed in the sensor chip 32, via the cover glass 12.

A light shielding film (not shown) is formed on the back surface side of the sensor chip 32 in association with a non-light receiving area of the light receiving surface. Moreover, the sensor chip 32 has a first terminal and a second terminal which can be tested from either of the front and back surface sides. The first terminal is formed on the back surface side of the sensor chip 32 so as to be exposed from the sensor chip 32. The second terminal is formed on the front surface side of the sensor chip 32 and electrically connected to the first terminal. The second terminal can be connected to an external device.

FIG. 3 is an enlarged sectional view showing an area 100 of the camera module enclosed by a dashed line in FIG. 1. The sensor chip 32 is thinned to a thickness of at most about 10 µm. A color filter/microlens 16 is provided on the light receiving surface on the back surface side of the sensor chip 32. An Al pad 17 and an Ni bump 18 are formed on the front surface side of the sensor chip 32 as an electrode. A back surface side opening is formed at a position of the sensor chip 32 corresponding to the Al pad 17 and the Ni bump 18. A portion of the Al pad 17 exposed from the back surface side opening serves as a first terminal. The Ni bump 18 located on the chip front surface side and corresponding to the Al pad 17 serves as a second terminal.

A dam (adhesive) 19 is formed in a desired area (here, the peripheral circuit section including the electrodes) different from the image pickup pixel section 41. The dam 19 is used to bond the cover glass 12 to the back surface side of the sensor chip 32. The image pickup pixel section 41 has a hollow structure in order to maintain a difference in a refractive index between the image pickup pixel section 41 and a lend material. However, this portion may be filled with a material having a lower refractive index than the material of the microlens. The cover glass 12 also serves to prevent dirt and dust from adhering to the light receiving section. In a step of installing interconnects to allow the second terminal to be connected to an external device, the cover glass 12 is effective for protecting the second terminal from dirt or damage and increasing the mechanical strength of the thinned sensor chip 32.

A passivation film 13A and an insulating layer 20 are formed on the front surface side of the sensor chip 32. The passive element chip 14 is mounted on the insulating layer 20 via a bonding layer 21. The periphery of the passive element chip 14 is covered with a resin layer (insulating member) 23. An Al pad 27 and an Ni bump 28 are also formed on the passive element chip 14 as electrodes. Cu interconnects 25 are formed for the resin layer 23 to connect the sensor chip 32 to the passive element chip 14. The Cu interconnects 25 are formed so as to extend from one surface side of the resin layer (insulating member) 23 on which the sensor chip 32 is mounted to the other surface side via a through-hole. The other surface side is covered with a solder resist 26. The Cu interconnects 25 electrically connect the sensor chip 32 to the passive element chip 14. A solder ball 15 is connected via an Au/Ni pad plating layer 22 to a part of the Cu interconnects 25 on the other surface of the resin layer 23 which is not covered with the solder resist 26.

An example of the size of the image pickup device shown in FIG. 3 will be described below. A thickness D1 from a bottom surface of the resin layer 23 to a top surface of the dam 19 is 180 µm. A thickness D1A from the bottom surface of the resin layer 23 to a front surface side of the passive element chip 14 is 25 µm. The thickness of the passive element chip 14 is 70 µm. The thickness of the bonding layer 21 is 25 µm. The sum D1B of these thicknesses is 95 µm. Furthermore, the thickness D1C of the sensor chip 32 (including the passivation film 13A and the insulating layer 20) is at most 10 µm. The thickness of an Si layer in which the image pickup element is formed is 4 µm. The thickness D1D of the dam is 50 µm. Moreover, the thickness D2 of the cover glass 12 is 300 to 400 µm.

According to the back-illuminated type solid-state image pickup device and camera module configured as described above, the peripheral circuit section can be tested at a wafer level using the Al pad 17. The image pickup pixel section can be tested at the wafer level by irradiating the light receiving surface with light and using the portion of the Al pad 17 which is exposed in the back surface side opening. Thus, the back-illuminated type solid-state image pickup device can be tested at the wafer level, facilitating the tests.

Figure 9:
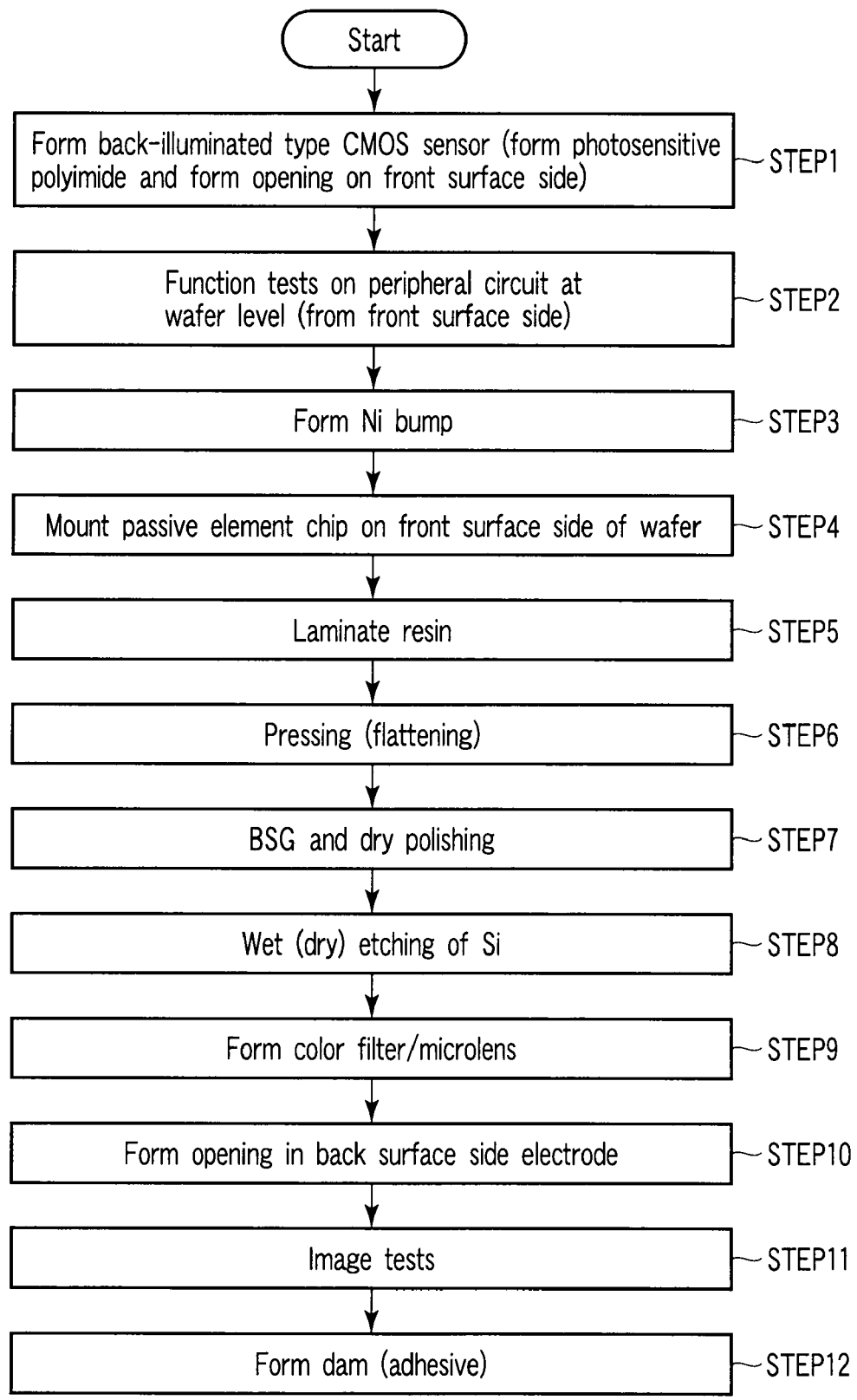
FIG. 9 is a first flow chart of a process of manufacturing a camera module, illustrating a method of manufacturing a semiconductor device according to an embodiment of the present invention.
Figure 10:
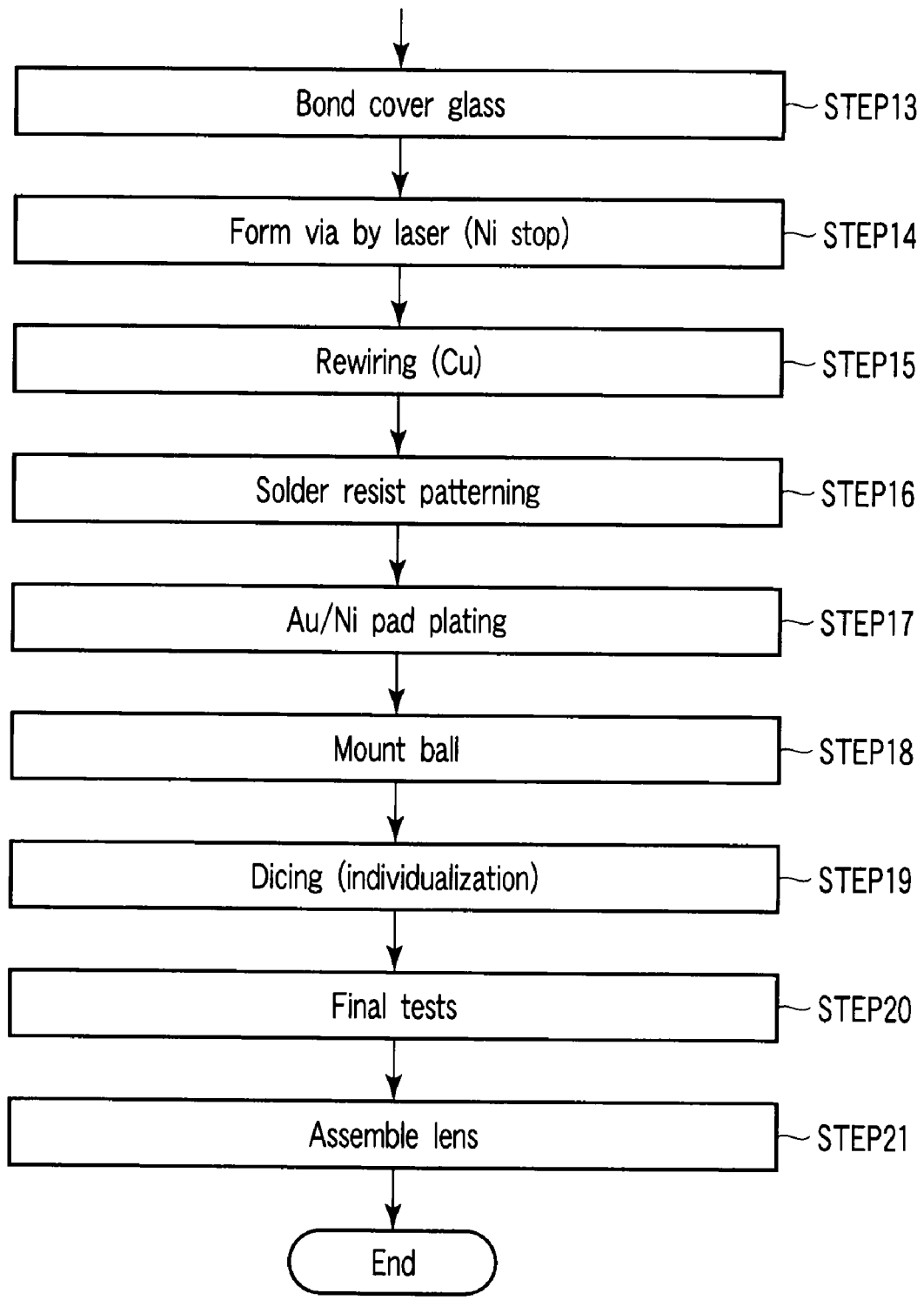
FIG. 10 is a second flow chart of the process of manufacturing the camera module, illustrating the method of manufacturing the semiconductor device according to the embodiment of the present invention.

Now, the process of manufacturing the camera module shown in FIGS. 1 to 3 will be described with reference to sectional views in FIGS. 4 to 8 and flowcharts in FIGS. 9 and 10.

First, a back-illuminated type CMOS sensor 13 is formed on a wafer using a well-known CMOS process. The CMOS sensor 13 has the image pickup pixel section and the peripheral circuit section for the image pickup pixel section. The pixels are arranged in the image pickup pixel section in a two-dimensional array. Each of the pixels is composed of the field-effect transistor and the photodiode. The peripheral circuit section has the driving circuit that selects and drives the image pickup pixel section, the signal processing circuit that processes the pixel signals output by the image pickup pixel section, and the data holding circuit that holds the data from the signal processing circuit. The interconnect layer is provided on the front surface side of the sensor 13 to drive the field-effect transistors in the image pickup pixel section. The light receiving surface of each of the photoelectric conversion elements is provided on the back surface side of the sensor 13.

The sensor 13 may be formed using an SOI wafer, in order to ensure the uniform thickness of the wafer in subsequently thinning the wafer. The thickness of a buried oxide film (BOX) depends on a back thinning process but may be, for example, about 200 nm. This is because the thickness preferably ensures the appropriate etching selection ratio of Si to an Si oxide film. Si on a BOX may have a thickness required for light reception and which is at most 10 µm.

As a final step of the Si process, photosensitive polyimide constituting the insulating layer 20 is formed, and an opening is formed in the insulating film 20 and passivation film 13A on the Al pad 17 on the front surface side to expose the peripheral circuit section (STEP 1). Subsequently, the peripheral circuit section is subjected to function tests at the wafer level using the Al pad 17 (STEP 2). At this time, the image pickup pixel section is located under the interconnect layer, preventing the light receiving section from being tested. Thus, the peripheral circuit section is subjected to the function tests to check how well the CMOS process has been carried out. If the peripheral circuit section does not operate in the tests, the device is determined to be defective and discarded or is marked so as to not to be fed to the subsequent process.

Subsequently, for passed wafers, the thin bump (Ni bump) 18 is formed on the Al pad 17 on the front surface side (STEP 3). In this case, Ni is formed to a thickness of 5 μm using an electroless plating method. The thickness of Ni may be appropriate to allow Ni to serve as a stopper during laser processing.

Figure 4:
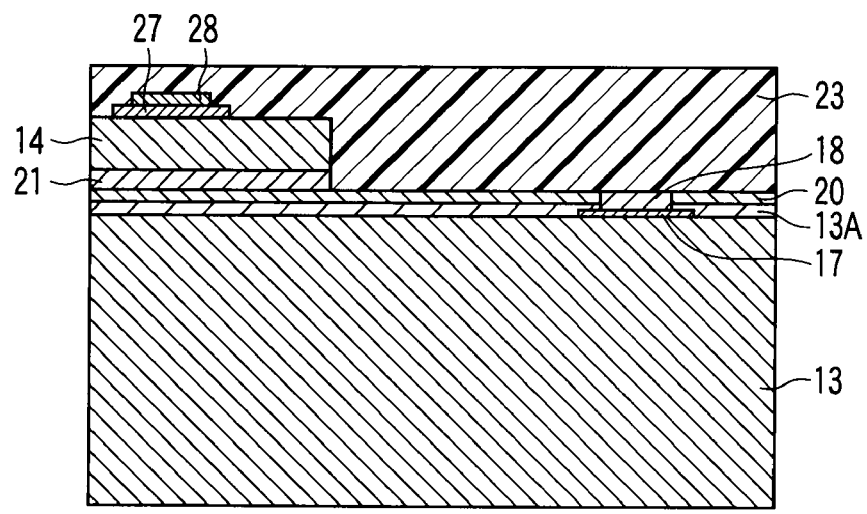
FIG. 4 is a sectional view of a first process of manufacturing a camera module, illustrating a method of manufacturing a semiconductor device according to an embodiment of the present invention.

Then, as shown in FIG. 4, the passive element chip 14 is mounted on the front surface side of the sensor 13 via the bonding layer 21 (STEP 4). Resin is laminated on the passive element chip 14 and the bonding layer 21 (STEP 5) and pressed for flattening (STEP 6). The resin layer 2 thus formed serves as a support member for the thinned sensor 13. In this step, flatness required for the subsequent backside grinding step has only to be maintained. Thus, the thickness of the resin layer 2 may vary by, for example, about 1 μm.

Figure 5:
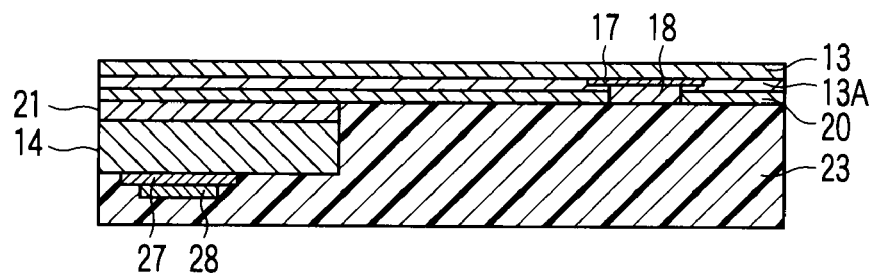
FIG. 5 is a sectional view of a second process of manufacturing a camera module.

Then, as shown in FIG. 5, the back surface side of the sensor 13 is mechanically ground and thinned by BSG (backside grinding) and dry polishing (STEP 7). At this time, the thickness of Si is desirably at most about 50 μm.

Subsequently, Si on the ground surface is wet etched (STEP 8). If the SOI wafer is used, Si is etched to the BOX. In this case, the thickness of Si remaining on the BOX is 4 μm, and the BOX thus remains. This etching step is not limited to wet etching but may be dry etching. In this case, etching conditions are preferably set to provide the appropriate etching selection ratio of $SiO_2$ to Si. The BOX is then thinned using a different etchant.

Figure 6:
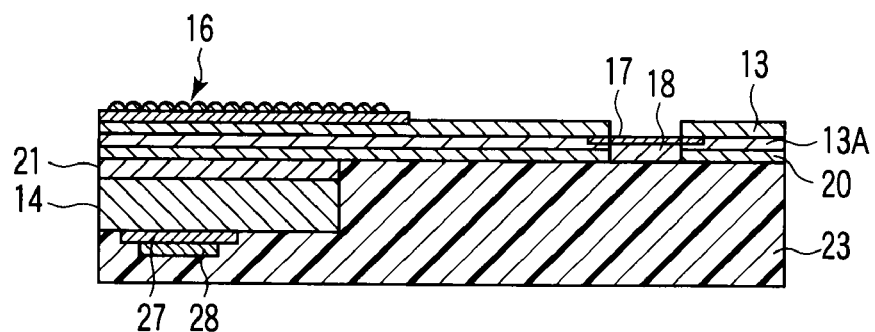
FIG. 6 is a sectional view of a third process of manufacturing a camera module.

Subsequently, as shown in FIG. 6, the pattern on the front surface side is aligned. The light shielding film and the color filter/microlens 16 are formed on the back surface side of the thinned Si by the lithography process (STEP 9).

Then, to allow testing from the back surface side on which the color filter/microlens 16 is formed, the sensor 13 is etched from the back surface side so as to reach the Ni bump 18 on the front surface side. The back surface side opening is thus formed in the terminal (Al pad 17) that can be tested from the back surface side (STEP 10). Laser ablation or dry etching through the material of the microlens or the like as a mask may be used to form the back surface side opening through which the back surface side electrode is exposed.

Then, the image pickup pixel section is subjected to image tests using the Al pad 17 exposed in the back surface side opening (STEP 11). Reference light is shed on the image pickup pixel section from the top of FIG. 6. An image signal is obtained from the Al pad 17 and checked. During the tests, the temperature may be increased or reduced for checking. These tests may be performed using a tester of a normal wafer level. Alternatively, a connection may be pre-established with the passive element chip 14 mounted on the front surface side so as to allow a circuit including the passive element to be tested. Only wafers providing a desired yield at this point in time are fed to the next manufacturing step.

Then, as shown in FIG. 7, the adhesive called the dam 19 is formed on the sensor 13 except for the light receiving section (STEP 12). The cover glass 12 formed at the wafer level is bonded to the dam 19 (STEP 13). In this case, the dam 19 desirably has a height of about 50 μm. Then, the light receiving section has a hollow structure to offer a refractive index lower than that of the material of the microlens. This enables maximization of the light condensing effect of the microlens. Alternatively, the hollow portion may be filled with a material offering a refractive index lower than that of the material of the microlens. Moreover, when formed so as to close the back surface side opening (substrate through-hole) previously formed in the back surface side electrode, the dam adhesive can protect the back surface side electrode.

Finally, as shown in FIG. 8, the resin layer 23 is melted and vaporized by laser so as to form an opening extending from the front surface side of the sensor 13 to the Ni bump 18 (STEP 14). Concurrently, an opening is formed in the terminal on the passive element chip 14, and the interconnects 25 are formed, which connects the openings together (STEP 15). For the interconnects 25, after the wet process etching the front surface side of the resin layer 23, Cu is formed all over the surface of the resin layer 23 by electroless plating, and the resulting seed layer is used to form Cu by electrolytic plating. The pattern is then formed by lithography. Subsequently, the solder resist 26 is formed and patterned (STEP 16). An area in which the solder ball 15 is to be formed is subjected to Au/Ni pad plating (STEP 17). The solder 15 is mounted on the Au/Ni pad plating layer 22 (STEP 18).

Subsequently, the wafer is diced into individual pieces using a dicer (STEP 19). The solder ball 15, mounted on the front surface side of the resulting chips, is used to subject the individual solid-state image pickup devices to final tests (STEP 20). The lens unit 11 is then mounted on the solid-state image pickup device for assembly (STEP 21).

With the above-described manufacturing method, during a manufacturing process, first, the peripheral circuit section is tested from the front surface side of the sensor 13. Subsequently, the microlens and the like are formed on the back surface side, and the image pickup pixel section is then tested. Thus, the wafer level camera module (WLCM) can be easily tested. Moreover, the wafer is divided into pieces by dicing to form the sensor chip 32, and the solid-state image pickup device is then subjected to the final tests. Thus, only wafers determined to be acceptable in each of the above-described steps are subjected to the subsequent manufacturing step. Consequently, camera modules can be efficiently and inexpensively manufactured with waste eliminated, allowing manufacturing efficiency to be improved.

With the above-described manufacturing method, the back surface side opening is formed for the sensor 13, and the front surface side terminal is exposed in the back surface side opening so that the electrode can be provided on the back surface side. However, a metal plug connected to the peripheral circuit section may be buried in the sensor 13, and the appropriate part of the metal plug is exposed from the back surface side of the sensor 13 by BSG and utilized as a test terminal.

Second Embodiment

FIG. 11 is a partly cutaway perspective view of a camera module illustrating a second embodiment of the present invention. In the camera module, the sensor chip 32 is mounted on a mounting substrate 31 (chip-on-board [COB]). A first terminal (corresponding to the Al pad 17 in FIG. 3) formed on the light receiving surface of the chip 32 is connected to the mounting substrate 31 by wire-bonding. A passive element chip 33 is surface-mounted (SMT) on the mounting substrate 31 on the periphery of the chip 32. Cover glass 34 is provided on the sensor chip 32. A lens unit 35 is provided on the cover glass 34. Thus, light entering the lens unit 35 is condensed onto the light receiving surface of the photoelectric conversion element in the sensor chip 32 via the cover glass 34.

In this configuration, the first terminal (the part of the Al pad 17 exposed in the back surface side opening in the Al pad 17 as shown in FIG. 3) is used for image tests on the image pickup pixel section 41. The first terminal is also used as a bonding pad when the sensor chip 32 is mounted. On the other hand, the second terminal (the bottom surface of the Al pad 17) is used for function tests on the peripheral circuit section in the wafer state during the manufacturing process.

Therefore, the above-described configuration can also exert effects substantially similar to those of the first embodiment. However, the second embodiment involves a larger mounting area than the first embodiment. Thus, one of the first and second embodiments may be selected according to required specifications, mounting facilities, and the like.

(Variations)

In the description of the first and second embodiments, by way of example, the resistor, the capacitor, and the like, which require relatively large pattern occupation areas, are formed in the passive element chip 14 or 33, which is mounted together with the sensor chip 32. However, of course, the passive element may be integrated into the sensor chip 32. Furthermore, instead of the passive element chip 14 or 33, an active element chip such as a DSP may be mounted together with the sensor chip 32, or the active element such as a DSP may be integrated into the sensor chip 32.

Furthermore, in the described example, each of the pixels 42-11, 42-12, . . . , 42-mn is composed of four field-effect transistors and a photodiode PD. However, a different configuration may be provided, and the configuration of the peripheral circuit section, the structure of the interconnects used to drive the pixels, and the like are not limited to the above-described example.

Moreover, in the above-described example, the pixels are arranged in the image pickup pixel section in the m×n two-dimensional array. However, the present invention is applicable to a configuration in which the pixels are staggered.

As described above, a solid-state image pickup device according to a first aspect of the present invention comprises an image pickup pixel section and a peripheral circuit section for the image pickup pixel section provided on the semiconductor substrate, the image pickup section having an array of a plurality of pixels each having a photoelectric conversion element and a field-effect transistor, an interconnect layer driving the field-effect transistor in the image pickup pixel section being formed on a first surface side of the semiconductor substrate, a light receiving surface of the photoelectric conversion element being located on a second surface side of the semiconductor substrate, and the solid-state image pickup device further comprises a first terminal exposed from the second surface side of the semiconductor substrate, and a second terminal electrically connected to the first terminal and connectable to an external device on the first surface side of the semiconductor substrate.

A solid-state image pickup device according to a second aspect of the present invention comprises an image pickup pixel section and a peripheral circuit section for the image pickup pixel section provided on a semiconductor substrate, the image pickup section having an array of a plurality of pixels each having a photoelectric conversion element and a field-effect transistor, an interconnect layer driving the field-effect transistor in the image pickup pixel section being formed on a first surface side of the semiconductor substrate, a light receiving surface of the photoelectric conversion element being located on a second surface side of the semiconductor substrate, and the solid-state image pickup device further comprises a pad electrode located on the first surface side of the semiconductor substrate and exposed from the second surface side of the semiconductor substrate, wherein a pad opening is formed on the pad electrode on the first surface side of the semiconductor substrate.

A camera module according to a third aspect of the present invention comprises a solid-state image pickup device comprising an image pickup pixel section in which a plurality of pixels each having a photoelectric conversion element and a field-effect transistor are arranged, and a peripheral circuit section for the image pickup pixel section, an interconnect layer driving the field-effect transistor in the image pickup pixel section being formed on a first surface side of the semiconductor substrate, a light receiving surface of the photoelectric conversion element being located on a second surface side of the semiconductor substrate, the camera module further comprising a lens which condenses incident light on the light receiving surface of the photoelectric conversion element, a member having the first surface side of the semiconductor substrate mounted on one surface of the member and an external connection terminal provided on the other surface of the member, and an interconnect formed on the member so as to extend from the one surface side on which the semiconductor substrate is mounted to the other surface side, the interconnect being electrically connected to an external connection terminal, and the solid-state image pickup device further comprises a first terminal exposed from the second surface side of the semiconductor substrate, and a second terminal formed on the first surface side of the semiconductor substrate and electrically connected to the first terminal and the interconnect layer.

A method of manufacturing the semiconductor device according to a fourth aspect of the present invention comprises forming a solid-state image pickup device comprising a image pickup pixel section in which a plurality of pixels each having a photoelectric conversion element and a field-effect transistor are arranged and a peripheral circuit section for the image pickup pixel section, an interconnect layer driving the field-effect transistor in the image pickup pixel section being formed on a first surface side of the semiconductor substrate, a light receiving surface of the photoelectric conversion element being located on a second surface side of the semiconductor substrate, testing the peripheral circuit section from the first surface side of the semiconductor substrate, then after testing the peripheral circuit section, thinning the second surface side of the semiconductor substrate to expose a first terminal from the second surface side of the semiconductor substrate, forming a lens condensing incident light, at a position on the thinned second surface side of the semiconductor substrate which position corresponds to the light receiving surface of the photoelectric conversion element, and after forming the lens, testing the image pickup pixel section using the first terminal exposed from the second surface side of the semiconductor substrate.

Furthermore, in the fourth aspect, the method further comprises, after testing the image pickup pixel section, dividing the semiconductor substrate into individual pieces and testing the solid-state image pickup device for each of the individualized semiconductor substrates.

An aspect of the present invention provides the solid-state image pickup device facilitating tests and the camera module using the solid-state image pickup device.

An aspect of the present invention provides the method of manufacturing the semiconductor device, which allows the manufacturing efficiency to be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A camera module comprising:

a solid-state image pickup device comprising an image pickup pixel section in which a plurality of pixels each having a photoelectric conversion element and a field-effect transistor are arranged, and a peripheral circuit section for the image pickup pixel section, an interconnect layer driving the field-effect transistor in the image pickup pixel section being formed on a first surface side of a semiconductor substrate, a light receiving surface of the photoelectric conversion element being located on a second surface side of the semiconductor substrate, the solid-state image pickup device further comprising a first terminal exposed from the second surface side of the semiconductor substrate, and a second terminal formed on the first surface side of the semiconductor substrate and electrically connected to the first terminal and the interconnect layer;

a lens which condenses incident light on the light receiving surface of the photoelectric conversion element;

a member having the first surface side of the semiconductor substrate mounted on one surface of the member and an external connection terminal provided on the other surface of the member;

an interconnect formed on the member so as to extend from the one surface side on which the semiconductor substrate is mounted to the other surface side, the interconnect being electrically connected to the external connection terminal; and a passive element chip mounted on the first surface side of the semiconductor substrate, wherein the member is a pressed resin layer which covers a periphery of the semiconductor substrate and the passive element chip.

2. The camera module according to claim 1, wherein the first terminal is a part of a pad formed on the first surface side of the semiconductor substrate which part is exposed in an opening on the second surface side.

3. The camera module according to claim 2, wherein the second terminal is a bump formed on the pad on the first surface side of the semiconductor substrate.

4. The camera module according to claim 1, wherein the peripheral circuit section includes a driving circuit configured to select and drive the image pickup pixel section, a signal processing circuit configured to execute signal processing on a pixel signal output by the image pickup pixel section, and a data holding circuit configured to hold data obtained from the signal processing circuit.

5. The camera module according to claim 4, wherein the interconnect layer driving the field-effect transistor includes an interconnect layer which transfers at least one of an address pulse, a reset pulse, and a read pulse which are supplied to the image pickup pixel section by the driving circuit.

6. The camera module according to claim 1, wherein the peripheral circuit section is subjected to a function test from the first surface side of the semiconductor substrate, and the image pickup pixel section is subjected to an image test using the first terminal with the light receiving surface irradiated with reference light.

7. The camera module according to claim 1, wherein the member is a mounting substrate, the interconnect is formed on the mounting substrate, the solid-state image pickup device is mounted on the mounting substrate, and the first terminal and the interconnect are connected together by wire-bonding.

8. The camera module according to claim 7, further comprising a passive element chip mounted on the mounting substrate in proximity to the solid-state image pickup device.

* * * * *